United States Patent
Sung et al.

(10) Patent No.: US 10,050,231 B2
(45) Date of Patent: Aug. 14, 2018

(54) DISPLAY DEVICE INCLUDING AN ENCAPSULATION MEMBER AND METHOD OF MANUFACTURING THE SAME

(71) Applicant: SAMSUNG DISPLAY CO., LTD., Yongin-si, Gyeonggi-Do (KR)

(72) Inventors: Wooyong Sung, Seoul (KR); Seunghun Kim, Hwaseong-si (KR); Minsang Kim, Suwon-si (KR); Seungyong Song, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/460,756

(22) Filed: Mar. 16, 2017

(65) Prior Publication Data
US 2018/0062113 A1   Mar. 1, 2018

(30) Foreign Application Priority Data

Aug. 23, 2016 (KR) .................. 10-2016-0107204

(51) Int. Cl.
*H01L 51/52* (2006.01)
*H01L 51/56* (2006.01)
(52) U.S. Cl.
CPC .......... *H01L 51/5256* (2013.01); *H01L 51/56* (2013.01); *H01L 2251/558* (2013.01)
(58) Field of Classification Search
None
See application file for complete search history.

(56) References Cited

U.S. PATENT DOCUMENTS

| 2015/0014663 A1* | 1/2015 | Kwak | .................. H01L 51/5253 257/40 |
| 2015/0236298 A1* | 8/2015 | Kim | .................... H01L 51/5253 438/26 |

FOREIGN PATENT DOCUMENTS

| KR | 10-0582734 | 5/2006 |
| KR | 10-0649220 | 11/2006 |
| KR | 10-1106173 | 1/2012 |
| KR | 10-2013-0072808 | 7/2013 |
| KR | 10-1389197 | 4/2014 |
| KR | 10-1440105 | 9/2014 |
| KR | 10-1445878 | 9/2014 |
| KR | 10-1469482 | 12/2014 |
| KR | 10-1538883 | 7/2015 |

(Continued)

*Primary Examiner* — Daniel Whalen
(74) *Attorney, Agent, or Firm* — F. Chau & Associates, LLC

(57) ABSTRACT

A display device includes a plurality of light emitting areas and a peripheral area adjacent to the light emitting areas. An encapsulation member disposed on the display member. The encapsulation member includes a first inorganic encapsulation layer. A plurality of mixed encapsulation patterns is disposed on the first inorganic encapsulation layer. Each of the mixed encapsulation patterns overlaps a corresponding light emitting area of the plurality of light emitting areas when viewed in a plan view. A second inorganic encapsulation layer is disposed on the first inorganic encapsulation layer. Each of the mixed encapsulation patterns includes a first segment adjacent to the first inorganic encapsulation layer when viewed in a cross section and a second segment disposed on the first segment. The first segment includes an organic material, and the second segment includes a mixture of the organic material and an inorganic material.

20 Claims, 18 Drawing Sheets

(56) References Cited

FOREIGN PATENT DOCUMENTS

| KR | 10-1563203 | 10/2015 |
| KR | 10-2016-0053356 | 5/2016 |
| KR | 10-2016-0069073 | 6/2016 |

* cited by examiner

DISPLAY DEVICE INCLUDING AN ENCAPSULATION MEMBER AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2016-0107204, filed on Aug. 23, 2016, the disclosure of which is incorporated by reference herein in its entirety.

TECHNICAL FIELD

Exemplary embodiments of the present invention relate to a display device, and more particularly to a method of manufacturing the same.

DISCUSSION OF RELATED ART

An organic light emitting display device may include an organic electroluminescent light emitting diode including an anode, an organic light emitting layer, and a cathode. The organic light emitting layer may be vulnerable to moisture or oxygen. In the case that the moisture or oxygen infiltrates the organic light emitting display device, the organic light emitting layer may be altered, and thus, various defects, such as a dark spot, or a pixel shrinkage may, occur. An encapsulation unit may protect the organic electroluminescent light emitting diode.

SUMMARY

An exemplary embodiment of the present invention provides a display device capable of blocking a foreign substance, such as oxygen or moisture, from entering into the display device and reducing formation of a crack caused by an external impact.

An exemplary embodiment of the present invention provides a method of manufacturing a display device having an increased foreign substance blocking characteristic by filling an inorganic material in a free volume of a patterned organic material.

An exemplary embodiment of the present invention provides a display device including a display member including a plurality of light emitting areas and a peripheral area adjacent to the light emitting areas. An encapsulation member disposed on the display member. The encapsulation member includes a first inorganic encapsulation layer. A plurality of mixed encapsulation patterns is disposed on the first inorganic encapsulation layer. Each of the mixed encapsulation patterns overlaps a corresponding light emitting area of the plurality of light emitting areas when viewed in a plan view. A second inorganic encapsulation layer is disposed on the first inorganic encapsulation layer. Each of the mixed encapsulation patterns includes a first segment adjacent to the first inorganic encapsulation layer when viewed in a cross section and a second segment disposed on the first segment. The first segment includes an organic material, and the second segment includes a mixture of the organic material and an inorganic material.

An amount of the inorganic material in the second segment may vary along a thickness direction of the mixed encapsulation patterns.

The amount of the inorganic material may decrease as a distance from the first segment decreases.

Each of the mixed encapsulation patterns may include a free volume of the organic material defined therein, and the inorganic material of the second segment is filled in at least a portion of the free volume.

An amount of the inorganic material in the free volume may be reduced as a distance from the first segment decreases.

The second inorganic encapsulation layer might not be overlapped with the mixed encapsulation patterns when viewed in a plan view.

Each of the mixed encapsulation patterns may include a third segment disposed on the second segment. The third segment may include an inorganic material and may have a shape integrally formed with the second inorganic encapsulation layer.

The second inorganic encapsulation layer may include a same inorganic material as the inorganic material included in the second segment of each of the mixed encapsulation patterns.

The display member may include a pixel definition layer including a plurality of openings. Each of the openings may be formed above a corresponding light emitting area of the plurality of light emitting areas. The mixed encapsulation patterns may each be respectively disposed in one of the openings.

The first inorganic encapsulation layer may be disposed on the pixel definition layer. The second inorganic encapsulation layer may be in direct contact with the first inorganic encapsulation layer.

The display device may include a plurality of dummy mixed patterns disposed in the peripheral area. Each of the dummy mixed patterns may include the organic material and the inorganic material mixed with the organic material.

Each of the dummy mixed patterns may include a first dummy segment adjacent to the first inorganic encapsulation layer and a second dummy segment disposed on the first dummy segment. The first dummy segment may include an organic material. The second dummy segment may include a mixture of the organic material and the inorganic material.

At least a portion of the dummy mixed patterns may be connected to at least one of the mixed encapsulation patterns.

The second segment may have a thickness of from about 50 angstroms to about 100 angstroms.

The display device may include a cover layer disposed on the second inorganic encapsulation layer to cover the second inorganic encapsulation layer.

An exemplary embodiment of the present invention provides a method of manufacturing a display device including preparing a display member including a plurality of light emitting areas and a peripheral area adjacent to the light emitting areas and forming an encapsulation member on the display member. The forming the encapsulation member includes depositing an inorganic material on the display member to form a first inorganic encapsulation layer. The forming the encapsulation member includes depositing and patterning an organic material on the first inorganic encapsulation layer to form a plurality of organic encapsulation patterns each respectively overlapping a corresponding light emitting area of the plurality of light emitting areas. The forming the encapsulation member includes infiltrating an inorganic material into the organic encapsulation patterns to form mixed encapsulation patterns, and depositing an inorganic material on the peripheral area to form a second inorganic encapsulation. The forming the mixed encapsulation patterns and the forming the second inorganic encapsulation layer are performed by a same process.

The organic encapsulation patterns may be formed by a solution process.

The forming the mixed encapsulation patterns may be performed by infiltrating the inorganic material into a free volume of the organic encapsulation patterns through a sequential vapor infiltration method.

The forming the mixed encapsulation patterns may include diffusing first precursors into the free volume of the organic encapsulation patterns and diffusing second precursors into the free volume of the organic encapsulation patterns such that the second precursors react with the first precursors to form the inorganic material in the free volume.

The forming the mixed encapsulation patterns may be performed by repeatedly performing the diffusion of the first precursors and the diffusion of the second precursors.

According to the above, a penetration of foreign substances, e.g., oxygen, or moisture, may be reduced or eliminated, and an occurrence of a crack, which may be caused by external impacts, may be reduced or prevented.

In a manufacturing method of a display device according to an exemplary embodiment of the present invention, an inorganic material may be filled in a free volume of a patterned organic material, and thus a penetration of foreign substances, e.g., oxygen, or moisture, into the display device may be reduced or eliminated.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1A:
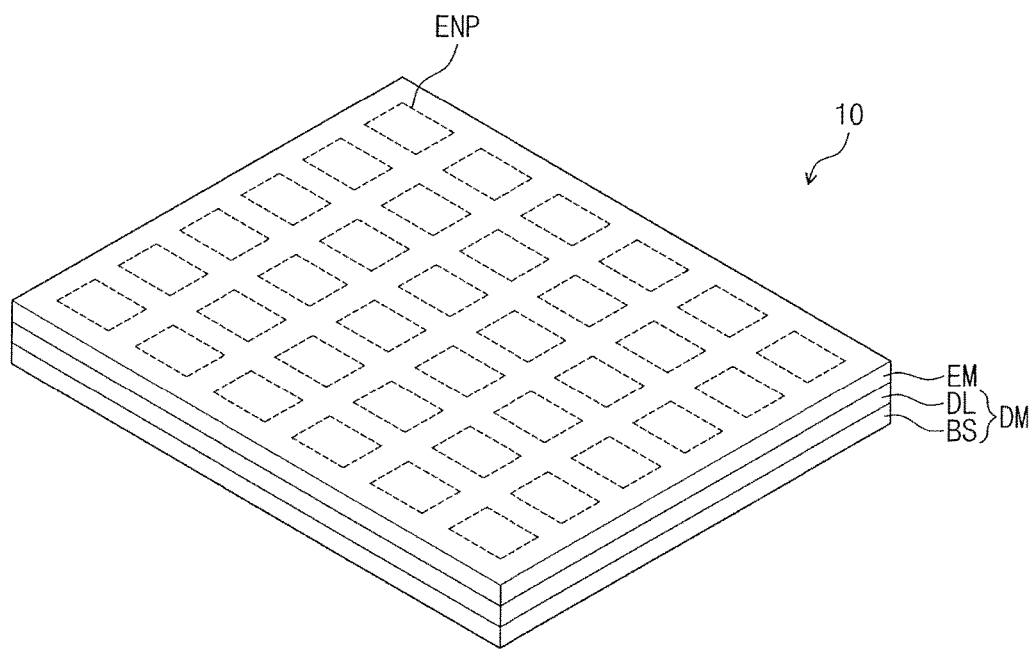
FIG. 1A is a coupled perspective view showing a display device according to an exemplary embodiment of the present invention.

It will be understood that when a component, such as a layer, a film, a region, or a plate, is referred to as being "on" another component, the component can be directly on the other component or intervening components may be present.

Like reference numerals may refer to like elements throughout the specification and drawings.

It will be understood that although the terms "first" and "second" may be used herein to describe various components, these components should not be limited by these terms.

Exemplary embodiments of the present invention will be described below in more detail with reference to the accompanying drawings. In this regard, the exemplary embodiments may have different forms and should not be construed as being limited to the exemplary embodiments of the present invention described herein.

Figure 1B:
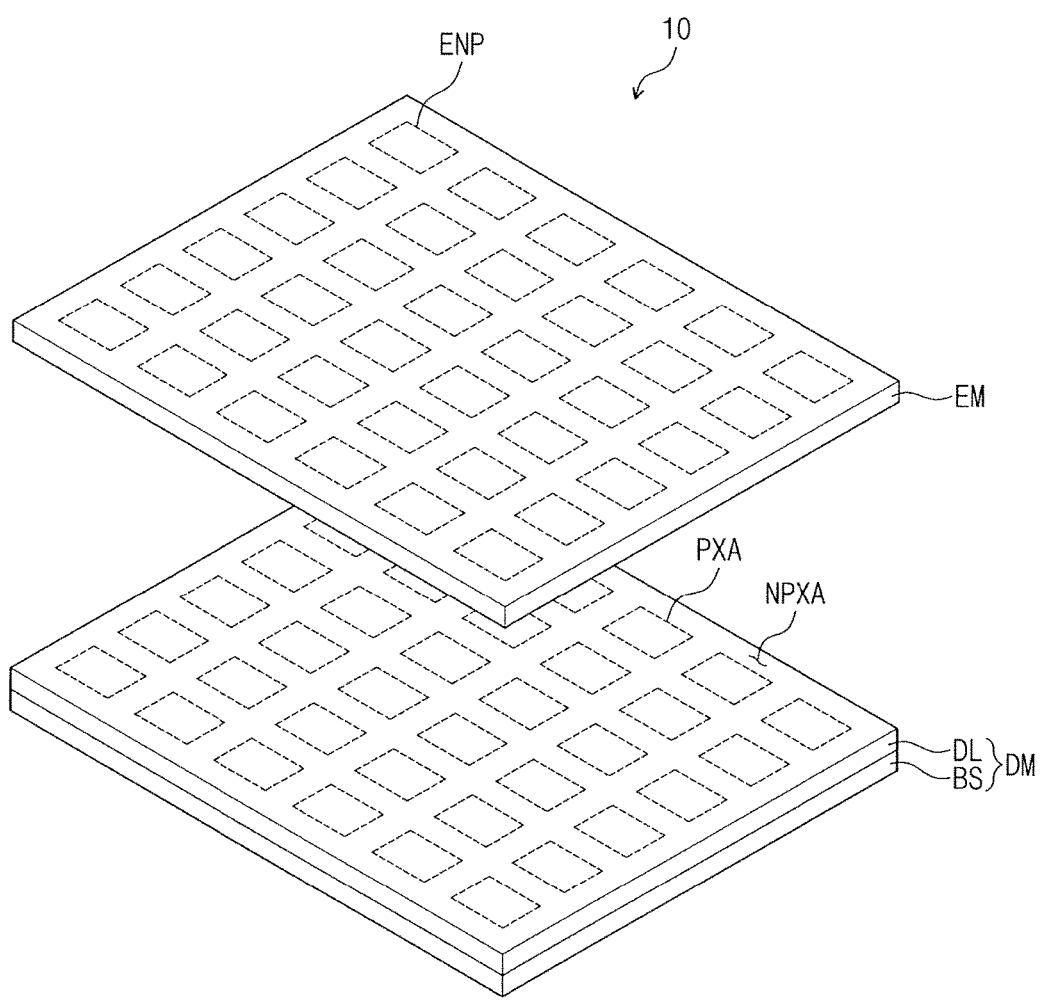
FIG. 1B is an exploded perspective view showing a display device according to an exemplary embodiment of the present invention.
Figure 2:
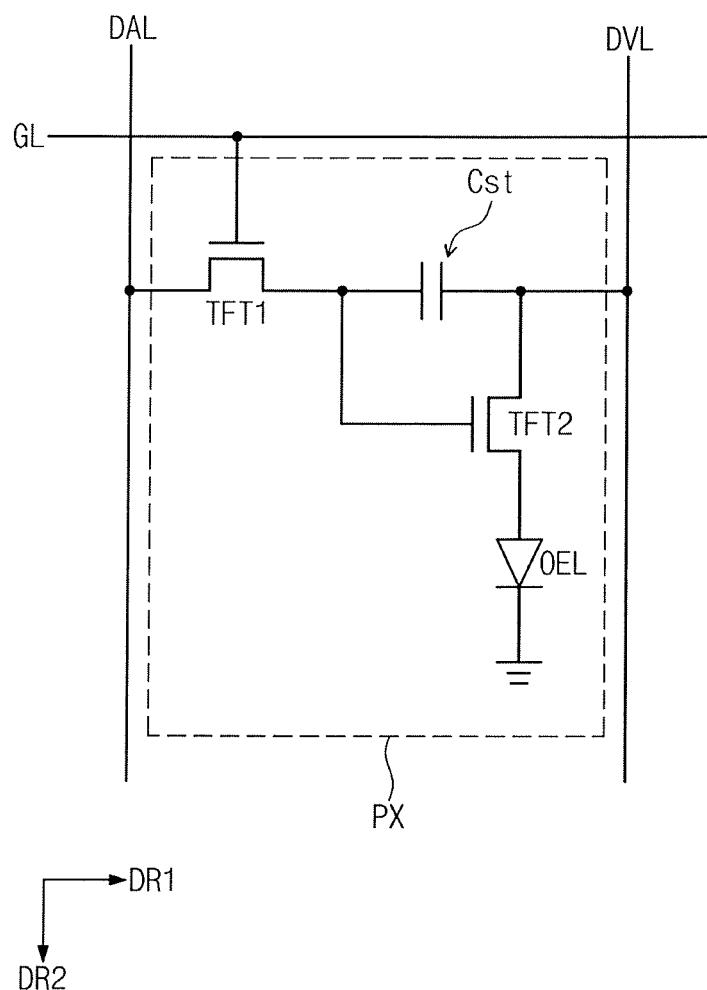
FIG. 2 is a circuit diagram showing a pixel included in a display device according to an exemplary embodiment of the present invention.

FIG. 1A is a coupled perspective view showing a display device according to an exemplary embodiment of the present invention. FIG. 1B is an exploded perspective view showing a display device according to an exemplary embodiment of the present invention. FIG. 2 is a circuit diagram showing a pixel included in a display device according to an exemplary embodiment of the present invention. A display device 10 will be described in more detail below with reference to FIGS. 1A, 1B, and 2.

Referring to FIGS. 1A and 1B, the display device 10 may include a display member DM and an encapsulation member EM.

The display member DM may include a plurality of light emitting areas PXA and a peripheral area NPXA. The light emitting areas PXA may be areas emitting light. Light may be emitted in the light emitting areas PXA in response to an electrical signal. The display member DM may combine light respectively exiting from the light emitting areas PXA to display an image.

The peripheral area NPXA may be adjacent to the light emitting areas PXA. The peripheral area PXA may be positioned at a boundary between adjacent light emitting areas PXA.

In an exemplary embodiment of the present invention, the light emitting areas PXA may be arranged in a matrix form, and the peripheral area NPXA may have a lattice shape surrounding each of the light emitting areas PXA. However, exemplary embodiments of the present invention are not limited thereto, and the light emitting areas PXA and the peripheral area NPXA may have various shapes according to an exemplary embodiment of the present invention.

The display member DM may include a base member BS and a display layer DL disposed on the base member BS.

The base member BS may be a substrate including an insulating material, e.g., a glass, a plastic, or a crystalline material.

The display layer DL includes a plurality of pixels. Each pixel may emit light (e.g., in response to an electrical signal applied thereto).

Referring to FIG. 2, each pixel PX may be connected to a line part including a gate line GL, a data line DAL, and a driving voltage line DVL. Each pixel PX may include thin film transistors TFT1 and TFT2 connected to the line part, an organic electroluminescent light emitting device OEL connected to the thin film transistors TFT1 and TFT2, and a capacitor Cst connected to the thin film transistors TFT1 and TFT2.

The gate line GL may extend in a first direction DR1. The data line DAL may extend in a second direction DR2 to cross the gate line GL. The driving voltage line DVL may extend in substantially a same direction as the direction (e.g., the second direction DR2) in which the data line DAL extends. The gate line GL may apply a scan signal to the thin film transistors TFT1 and TFT2. The data line DAL may apply a data signal to the thin film transistors TFT1 and TFT2. The driving voltage line DVL may apply a driving voltage to the thin film transistors TFT1 and TFT2.

The thin film transistors TFT1 and TFT2 may include a driving thin film transistor TFT2 controlling the organic electroluminescent light emitting device OEL and a switching thin film transistor TFT1 switching the driving thin film transistor TFT2. In an exemplary embodiment of the present invention, each pixel PX may include two thin film transistors TFT1 and TFT2; however, exemplary embodiments of the present invention are not limited thereto, and the number of the thin film transistors included in each pixel PX is not limited to two. As an example, each pixel PX may include one thin film transistor and one capacitor. Alternatively, each pixel PX may include three or more thin film transistors and two or more capacitors.

The switching thin film transistor TFT1 may include a first gate electrode, a first source electrode, and a first drain electrode. The first gate electrode may be connected to the gate line GL, and the first source electrode may be connected to the data line DAL. The first drain electrode may be connected to a first common electrode through a contact hole. The switching thin film transistor TFT1 may apply a data signal provided through the data line DAL to the driving thin film transistor TFT2 in response to a scan signal provided through the gate line GL.

The organic electroluminescent light emitting device OEL may include a first electrode connected to the driving thin film transistor TFT2 and a second electrode receiving a second power voltage. The organic electroluminescent light emitting device OEL may include a light emitting pattern disposed between the first electrode and the second electrode.

The organic electroluminescent light emitting device OEL may emit light during a turn-on period of the driving thin film transistor TFT2. The light generated by the organic electroluminescent light emitting device OEL may have a color determined by a material included in the light emitting pattern. For example, red, green, blue or white light may be generated by the organic electroluminescent light emitting device OEL.

Referring to FIGS. 1A and 1B, the encapsulation member EM may be disposed on the display member DM. The encapsulation member EM may substantially cover the display layer DL. The encapsulation member EM may protect the display layer from external moisture or contaminants.

The encapsulation member EM may include a plurality of mixed encapsulation patterns ENP. The mixed encapsulation patterns ENP may each overlap with the light emitting areas PXA.

Figure 3A:
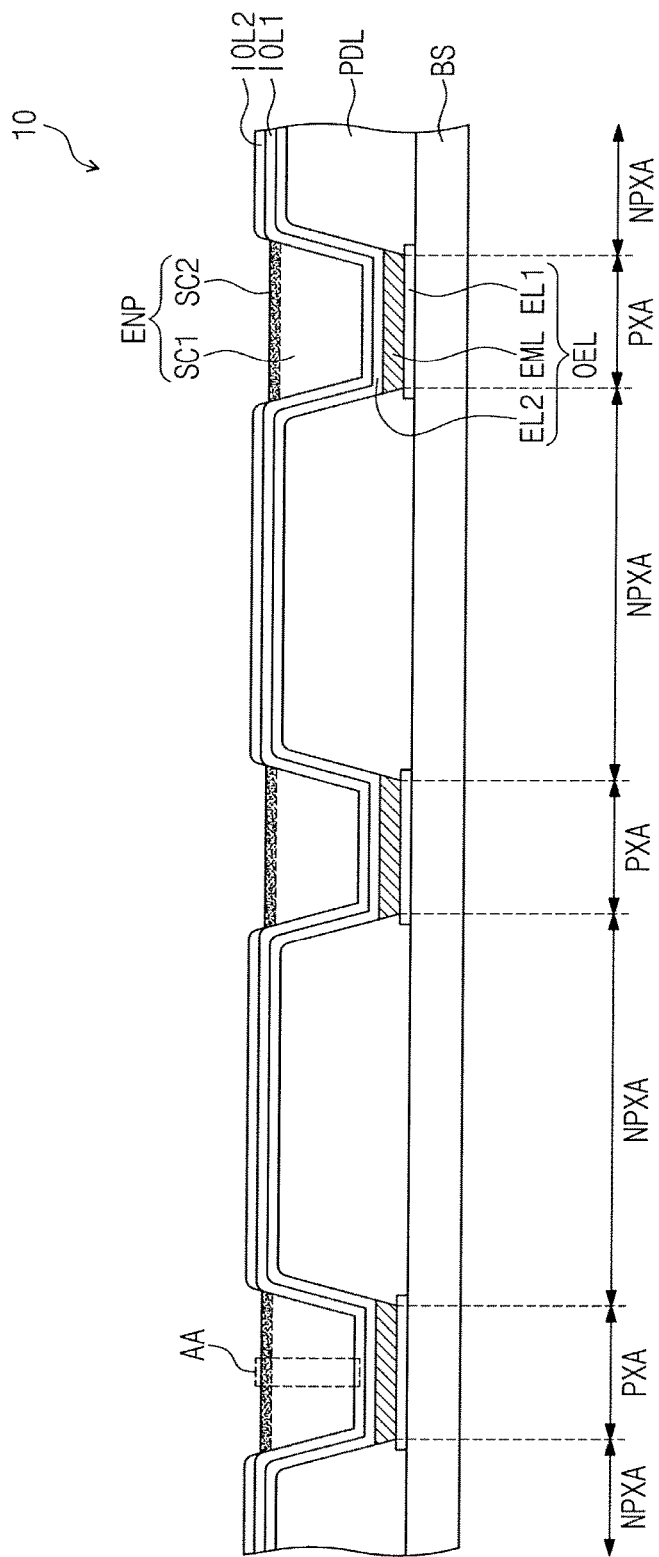
FIG. 3A is a cross-sectional view showing a display device according to an exemplary embodiment of the present invention.
Figure 3B:
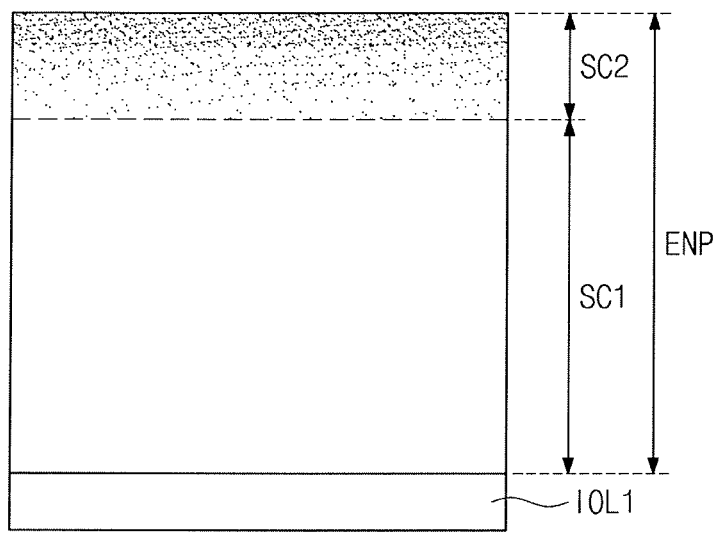
FIG. 3B is an enlarged cross-sectional view showing a portion AA of FIG. 3A.

FIG. 3A is a cross-sectional view showing a display device according to an exemplary embodiment of the present invention. FIG. 3B is an enlarged cross-sectional view showing a portion AA of FIG. 3A.

Referring to FIG. 3A, the display device 10 may include a base member BS, the display layer DL, and the encapsulation member EM.

The base member BS may include an insulating material, e.g., a glass, a plastic, or a crystalline material. The base member BS may include an organic polymer, such as polyethylene terephthalate (PET), polyethylene naphthalate (PEN), polyimide or polyether sulfone. An organic material included in the base member BS may be selected in consideration of a mechanical strength, a thermal stability, a transparency, a surface smoothness, an ease of handling and a water repellency of the organic material.

A functional layer may be disposed on the base member BS. The functional layer may include a buffer layer or a barrier layer. The buffer layer may increase a coupling force between the base member BS and the display layer DL. The barrier layer may reduce or prevent entrance of a foreign substance into the display layer DL.

The display layer DL may include a pixel definition layer PDL and the organic electroluminescent light emitting device OEL. A plurality of openings may be formed in the pixel definition layer PDL. The openings may define the light emitting areas PXA.

The organic electroluminescent light emitting device OEL may include a first electrode EL1, a second electrode EL2 above the first electrode EL1, and a light emitting layer EML disposed between the first electrode EL1 and the second electrode EL2.

The first electrode EL1 may serve as a pixel electrode or a positive electrode. The first electrode EL1 may be a transmissive type electrode, a transflective type electrode, or a reflective type electrode. When the first electrode EL1 is a transmissive type electrode, the first electrode EL1 may include indium tin oxide (ITO), indium zinc oxide (IZO), zinc oxide (ZnO), or indium tin zinc oxide (ITZO). When the first electrode EL1 is the transflective type electrode or the reflective type electrode, the first electrode EL1 may include Ag, Mg, Al, Pt, Pd, Au, Ni, Nd, Ir, Cr, or a mixture thereof.

The second electrode EL2 may serve as a common electrode or a negative electrode. The second electrode EL2 may be a transmissive type electrode, a transflective type electrode, or a reflective type electrode. When the second electrode EL2 is the transmissive type electrode, the second electrode EL2 includes Li, Ca, LiF/Ca, LiF/Al, Al, Mg, BaF, Ba, Ag, a compound thereof, or a mixture thereof (e.g., a mixture of Ag and Mg). As an example, the second electrode EL2 may include indium tin oxide (ITO), indium zinc oxide (IZO), zinc oxide (ZnO), or indium tin zinc oxide (ITZO). When the second electrode EL2 is a transflective type electrode or the reflective type electrode, the second electrode EL2 may include Ag, Mg, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). As an example, the second electrode EL2 may have a multi-layer structure including a reflective or transflective layer including the above-mentioned materials and a transparent conductive layer including ITO, IZO, ZnO, or ITZO.

The first electrode EL1 may be a reflective type electrode, and the second electrode EL2 may be a transflective type electrode or a transmissive type electrode. The organic electroluminescent light emitting display device OEL may be a front surface light emitting type organic electroluminescent light emitting device; however, exemplary embodiments of the present invention are not limited thereto. For example, the organic electroluminescent light emitting display device OEL may be a rear surface light emitting type organic electroluminescent light emitting device.

The pixel definition layer PDL may be disposed on the first electrode EL1. As an example, the pixel definition layer PDL may substantially cover a first portion of the first electrode EL1, and a second portion of the first electrode EH not covered by the pixel definition layer PDL may be exposed. The pixel definition layer PDL may include a metal-fluoride ion compound. For example, the pixel definition layer PDL may include one of LiF, BaF2, or CsF. The metal-fluoride ion compound may have a predetermined thickness, and the metal-fluoride ion compound may have an insulating property.

The light emitting layer EML may be disposed between the first electrode EL1 and the second electrode EL2. A plurality of common layers may further be disposed between the first electrode EL1 and the second electrode EL2. The light emitting layer EML may be overlapped with the light emitting area PXA. A light emitting layer EML may be disposed in each opening formed in the pixel definition layer PDL.

The encapsulation member EM may include a first inorganic encapsulation layer IOL1, a plurality of mixed encapsulation patterns ENP above the first inorganic encapsulation layer IOL1, and a second inorganic encapsulation layer IOL2 disposed on the first inorganic encapsulation layer IOL1.

The first inorganic encapsulation layer IOL1 may be disposed on the display member DM. As an example, the first inorganic encapsulation layer IOL1 may be in direct contact with the second electrode EL2. The first inorganic encapsulation layer IOL1 may overlap the light emitting areas PXA and the peripheral area NPXA. The first inorganic encapsulation layer IOL1 may include an inorganic material, e.g., aluminum oxide ($Al_2O_3$), oxide silicon (SiOx), silicon nitride (SiNx), oxynitride silicon (SiON), zinc oxide (ZnO), strontium oxide (SrO), titanium oxide ($TiO_2$), hafnium oxide ($HfO_2$) or tin oxide ($SnO_2$).

The mixed encapsulation patterns ENP may be disposed on the first inorganic encapsulation layer IOL1. The mixed encapsulation patterns ENP may each overlap the light emitting areas PXA, respectively. The mixed encapsulation patterns ENP may each be disposed in openings formed through the pixel definition layer PDL.

The second inorganic encapsulation layer IOL2 may be disposed on the first inorganic encapsulation layer IOL1. The second inorganic encapsulation layer IOL2 may overlap the peripheral area. The second inorganic encapsulation layer IOL2 might not overlap the mixed encapsulation patterns ENP when viewed in a plan view. However, at least a portion of the second inorganic encapsulation layer IOL2 may overlap each of the mixed encapsulation patterns ENP when viewed in a plan view.

The second inorganic encapsulation layer IOL2 may include an inorganic material. The second inorganic encapsulation layer IOL2 may include a same inorganic material as an inorganic material included in the first inorganic encapsulation layer IOL1.

Referring to FIGS. 3A and 3B, each of the mixed encapsulation patterns ENP may include a first segment SC1 and a second segment SC2 when viewed in a cross section. The first segment SC1 may be disposed adjacent to the first inorganic encapsulation layer IOL1 when viewed in a cross section. The second segment SC2 may be disposed on the first segment SC1 and may be spaced apart from the first encapsulation layer IOL1 when viewed in a cross section.

The first segment SC1 may include an organic material. The second segment SC2 may include an organic material and an inorganic material mixed with the organic material. The organic material included in the first segment SC1 may be the same as an organic material included in the second segment SC2. For example, the organic material may include polyethylene terephthalate, polyethylene naphthalate, polycarbonate, polyimide, polyethylene sulfonate, polyoxymethylene, and/or polyarylate.

The second segment SC2 may include an organic material mixed with an inorganic material. As an example, the second segment SC2 may include an organic material and an inorganic material provided in the organic material. The organic material included in the second segment SC2 may be the same as an organic material included in the first segment SC1. The inorganic material included in the second segment SC2 may be the same as an inorganic material included in the second inorganic encapsulation layer IOL2.

A content of the inorganic material in the second segment SC2 may be changed in a thickness direction of the mixed encapsulation pattern ENP. The content of the inorganic material may refer to a volume of the inorganic material with respect to a total volume of the second segment SC2. The content of the inorganic material in the second segment SC2 may be changed in a thickness direction of the second segment SC2. The content of the inorganic material in the second segment SC2 may decrease as a distance from the first segment SC1 decreases.

The second segment SC2 may be disposed on the first segment SC1 in the mixed encapsulation pattern ENP. The second segment SC2 may have a thickness of from about 50 angstroms to about 100 angstroms. When the thickness of the second segment SC2 is smaller than about 50 angstroms, a barrier characteristic of the second segment SC2 may be insufficient to block external moisture and oxygen, and when the thickness of the second segment SC2 is greater than about 100 angstroms, a process time may become longer, and thus a manufacturing cost may be increased.

The mixed encapsulation pattern ENP may overlap the light emitting area PXA and might not overlap the peripheral area NPXA. Although some of the mixed encapsulation patterns ENP may be cracked due to external impacts, the crack might not be propagated to other mixed encapsulation patterns ENP adjacent to the cracked mixed encapsulation patterns ENP since the mixed encapsulation patterns ENP are spaced apart from each other without being overlapped. Thus, the display device may 10 may better endure an external impact.

The mixed encapsulation pattern ENP according to an exemplary embodiment of the present invention may include the organic material and the inorganic material mixed with the organic material, and thus the mixed encapsulation pattern ENP may reduce or prevent external moisture and oxygen from passing therethrough.

The mixed encapsulation pattern ENP according to an exemplary embodiment of the present invention may include the organic material and the inorganic material provided in the organic material, and thus the mixed encapsulation pattern ENP may reduce or prevent external moisture and oxygen from entering the organic electroluminescent light emitting device after passing through the organic material. Thus, damage to the organic electroluminescent light emitting device OEL may be reduced or prevented.

Figure 4A:
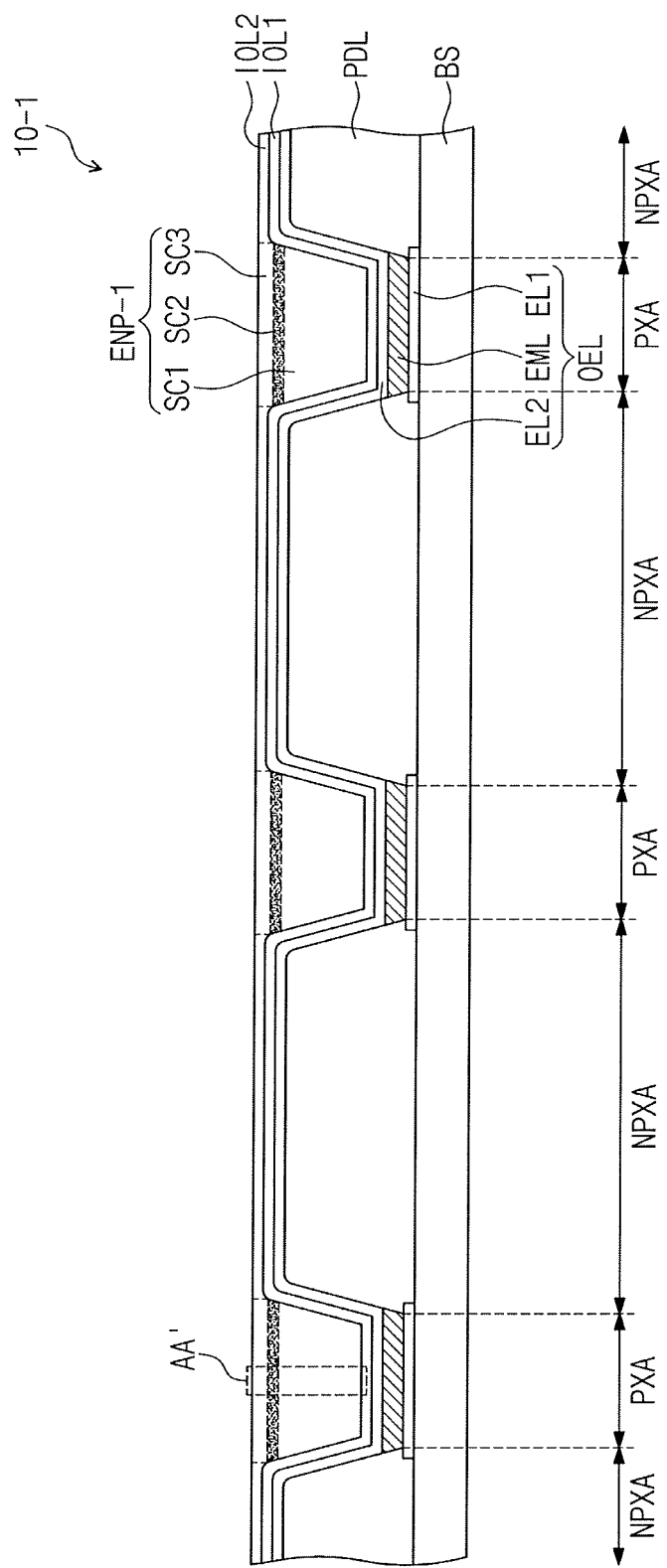
FIG. 4A is a cross-sectional view showing a display device according to another exemplary embodiment of the present invention.
Figure 4B:
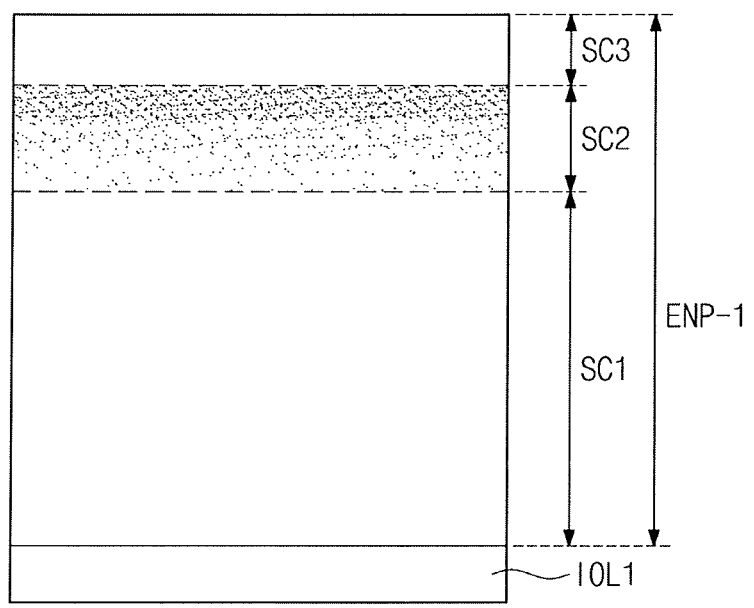
FIG. 4B is an enlarged cross-sectional view showing a portion AA' of FIG. 4A.

FIG. 4A is a cross-sectional view showing a display device according to an exemplary embodiment of the present invention. FIG. 4B is an enlarged cross-sectional view showing a portion AA' of FIG. 4A. A display device 10-1 will be described in more detail below with reference to FIGS. 4A and 4B. In FIGS. 4A and 4B, the same reference numerals may refer to the same elements as in FIGS. 3A and 3B, and thus duplicative descriptions may be omitted.

Referring to FIG. 4A, the display device 10-1 may include mixed encapsulation patterns ENP-1 disposed on the first inorganic encapsulation layer IOL1. The mixed encapsulation patterns ENP-1 may each overlap a corresponding light emitting area PXA. The mixed encapsulation patterns ENP-1 may each be disposed in openings for in the pixel definition layer PDL.

Referring to FIGS. 4A and 4B, each of the mixed encapsulation patterns ENP-1 may include the first segment SC1, the second segment SC2, and a third segment SC3 when viewed in a cross section. The first segment SC1 may be adjacent to the first inorganic encapsulation layer IOL when viewed in a cross section. The second segment SC2 may be disposed on the first segment SC1 and spaced apart from the first inorganic encapsulation layer IOL1 when viewed in a cross section.

Each of the mixed encapsulation patterns ENP-1 may include the third segment SC3 disposed on the second segment SC2 when viewed in a cross section. The third segment SC3 may include an inorganic material. Alternatively, the third segment SC3 may include an inorganic material. The inorganic material included in the third segment SC3 may be the same as an inorganic material included in the second inorganic encapsulation layer IOL2.

The third segment SC3 may be connected to the second inorganic encapsulation layer IOL2. The third segment SC3 may be integrally formed with the second inorganic encapsulation layer IOL2. According to an exemplary embodiment of the present invention, the third segment SC3 may have a thickness smaller than a thickness of the second inorganic encapsulation layer IOL2.

Figure 5A:
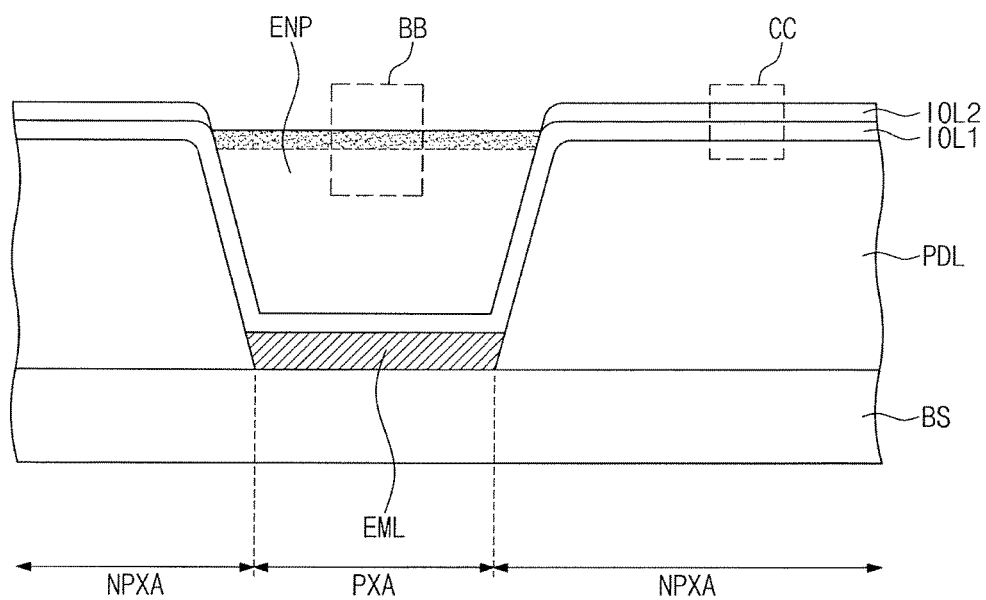
FIG. 5A is a cross-sectional view showing a light emitting area and a peripheral area disposed adjacent to the light emitting area of the display device shown in FIG. 3A.
Figure 5B:
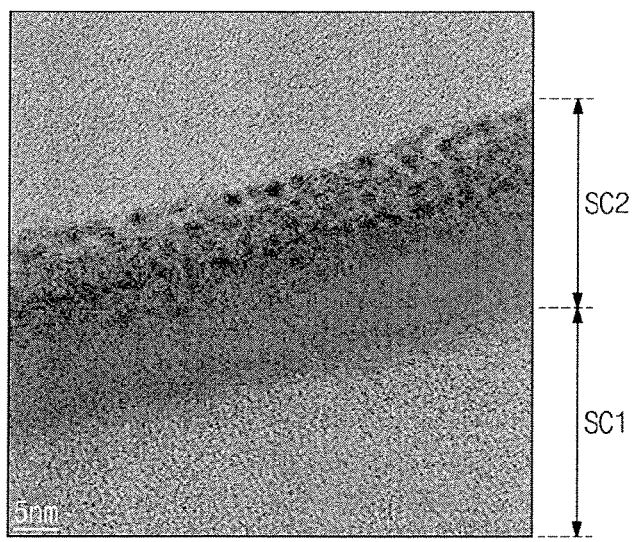
FIG. 5B is a view taken through a microscope to show an enlarged cross-section of a portion BB of FIG. 5A.
Figure 5C:
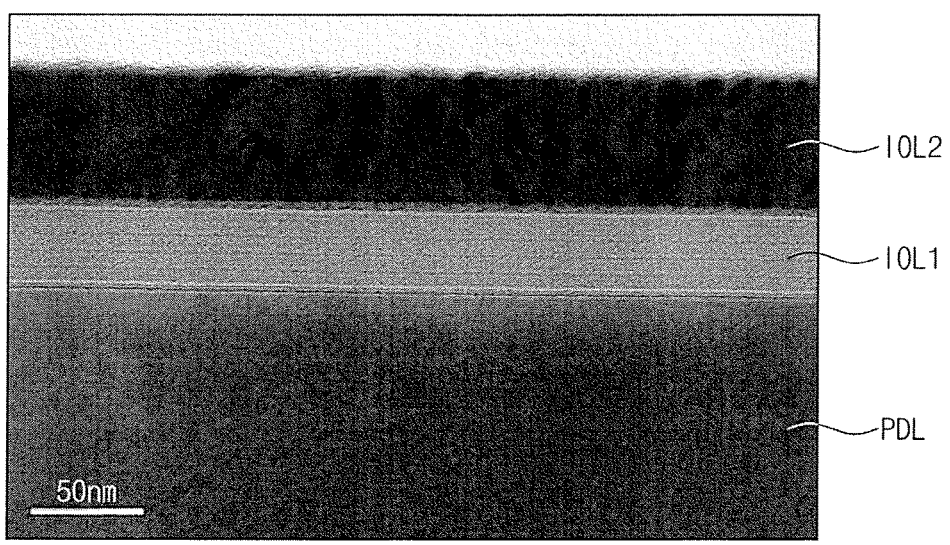
FIG. 5C is a view taken through a microscope to show an enlarged cross-section of a portion CC of FIG. 5A.

FIG. 5A is a cross-sectional view showing a light emitting area and a peripheral area adjacent to the light emitting area of the display device shown in FIG. 3A. FIG. 5B is a view taken through a microscope to show an enlarged cross-section of a portion BB of FIG. 5A. FIG. 5C is a view taken through a microscope to show an enlarged cross-section of a portion CC of FIG. 5A. In FIGS. 5A to 5C, the same reference numerals may refer to the same elements as in FIG. 3A, and thus duplicative descriptions may be omitted.

For the convenience of explanation, FIG. 5A shows only the light emitting layer EML and the pixel definition layer PDL, and others are omitted. Accordingly, the first inorganic encapsulation layer IOL1 of the encapsulation member is directly disposed on the pixel definition layer PDL.

The mixed encapsulation pattern ENP may be disposed on the first inorganic encapsulation layer IOL1. The mixed encapsulation patterns ENP may respectively overlap the light emitting areas PXA. The mixed encapsulation pattern ENP may each be disposed in opening formed through the pixel definition layer PDL.

The second inorganic encapsulation layer IOL2 may be disposed on the first inorganic encapsulation layer IOL1. The second inorganic encapsulation layer IOL2 may overlap the peripheral area. The second inorganic encapsulation layer IOL2 may be in direct contact with the first inorganic encapsulation layer IOL1 above the pixel definition layer PDL.

Referring to FIG. 5B, the mixed encapsulation pattern ENP of the display device according to an exemplary embodiment of the present invention may include the first segment SC1 and the second segment SC2. The first segment SC1 may include an organic material, and the second segment SC2 may include an organic material and an inorganic material mixed with the organic material after being infiltrated into a free volume of the organic material. The inorganic material may be infiltrated into the organic material from an upper direction, and thus a composition ratio between the inorganic material and the organic material of the second segment SC2 may vary along a thickness direction of the second segment SC2.

Referring to FIG. 5C, the mixed encapsulation pattern ENP might not be disposed on the pixel definition layer PDL in the display device according to an exemplary embodiment of the present invention, and thus the first inorganic encapsulation layer IOL1 and the second inorganic encapsulation layer IOL2 may be sequentially stacked on the pixel definition layer PDL. The second inorganic encapsulation layer IOL2 may be in direct contact with the first inorganic encapsulation layer IOL1.

Figure 6A:
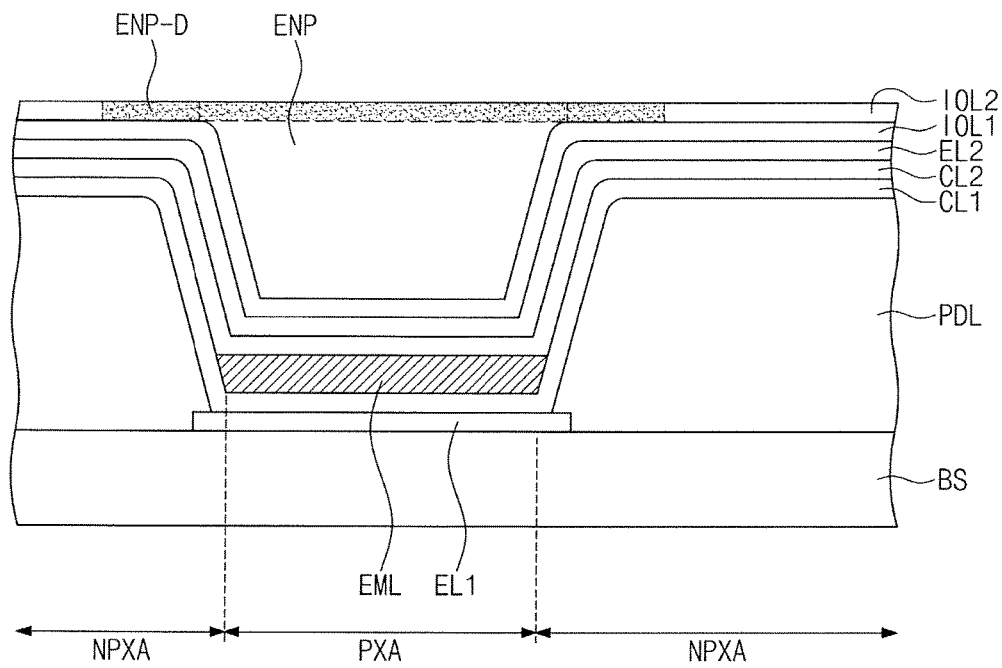
FIGS. 6A and 6B are cross-sectional views showing a light emitting area and a peripheral area adjacent to the light emitting area of a display device according to an exemplary embodiment of the present invention.
Figure 6B:
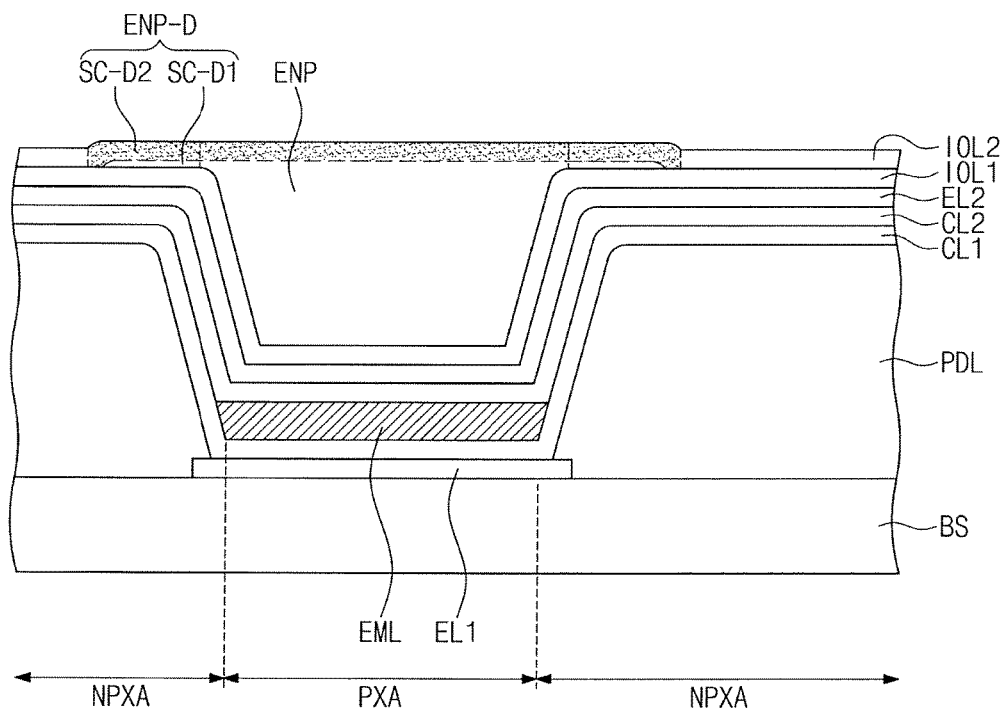

FIGS. 6A and 6B are cross-sectional views showing a light emitting area and a peripheral area adjacent to the light emitting area of a display device according to an exemplary embodiment of the present invention. In FIGS. 6A and 6B, the same reference numerals may refer to the same elements as in FIG. 5A, and thus duplicative descriptions may be omitted.

Referring to FIGS. 6A and 6B, the display device according to an exemplary embodiment of the present invention may include a dummy mixed pattern ENP-D. The dummy mixed pattern ENP-D may be positioned in the peripheral area NPXA.

The dummy mixed pattern ENP-D may be a portion extending from the mixed encapsulation pattern ENP. As an example, the dummy mixed pattern ENP-D may be connected to the mixed encapsulation pattern ENP; however, exemplary embodiments of the present invention are not limited thereto. For example, the dummy mixed pattern ENP-D may be a mixed encapsulation pattern separated from the mixed encapsulation pattern ENP.

The dummy mixed pattern ENP-D may have various structures. For example, the dummy mixed pattern ENP-D may have a single-layer structure including an organic material and an inorganic material mixed with the organic material. The organic material included in the dummy mixed pattern ENP-D may be the same as an organic material included in the mixed encapsulation pattern ENP. An inorganic material included in the dummy mixed pattern ENP-D may be the same as an inorganic material included in the second segment SC2 of the mixed encapsulation pattern ENP.

As an example, the dummy mixed pattern ENP-D may include a plurality of segments. The dummy mixed pattern ENP-D may include a first dummy segment SC-D1 adjacent to the first inorganic encapsulation layer IOL1 and a second dummy segment SC-D2 disposed on the first dummy segment SC-D1.

The first dummy segment SC-D1 may include an organic material. The organic material included in the first dummy segment SC-D1 may be the same as an organic material included in the mixed encapsulation pattern ENP. The second dummy segment SC-D2 may include an organic material and an inorganic material mixed with the organic material. An organic material included in the second dummy segment SC-D2 may be the same as an organic material included in the mixed encapsulation pattern ENP, and the inorganic material included in the second dummy segment SC-D2 may be the same as an inorganic material included in the second segment SC2 of the mixed encapsulation pattern ENP.

First and second common layers CL1 and CL2 may respectively correspond to the common layers described with reference to FIG. 3A. The first and second common layers CL1 and CL2 may each be positioned over the pixels PX. The first and second common layers CL1 and CL2 may be formed in each pixel PX through a patterning process. Each of the first and second common layers CL1 and CL2 may have a single-layer structure including a single material, a single-layer structure including different materials from each other, or a multi-layer structure including a plurality of layers including different materials from each other. The first and second common layers CL1 and CL2 may be positioned in a hole transport area including at least one of a hole transport layer, a hole injection layer, a hole buffer layer, and an electron blocking layer. The first and second common layers CL1 and CL2 may be positioned in an electron transport area including at least one of an electron transport layer, an electron injection layer, an electron buffer layer, or a hole blocking layer.

Figure 7:
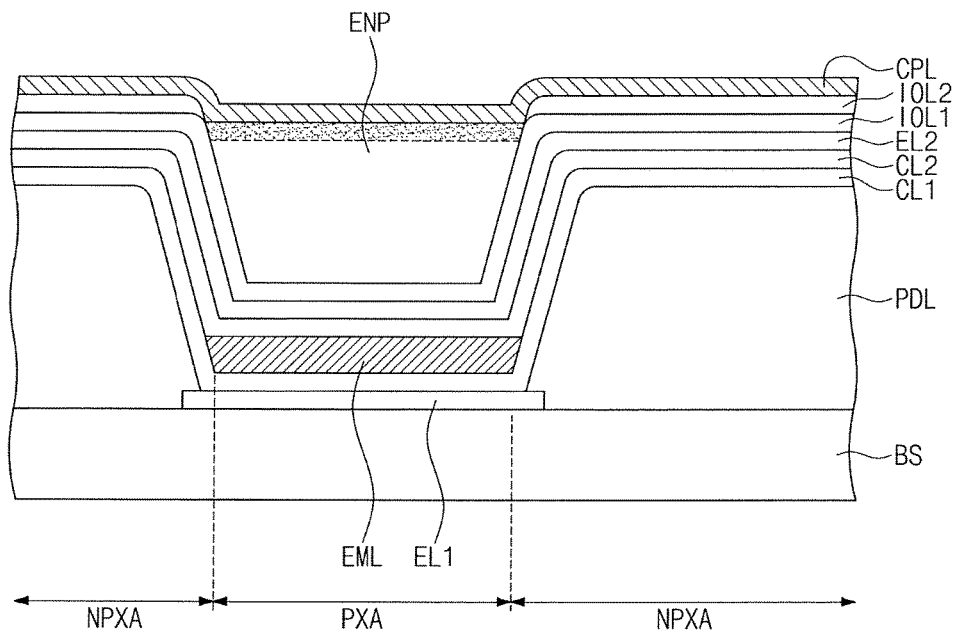
FIG. 7 is a cross-sectional view showing a light emitting area and a peripheral area adjacent to the light emitting area of a display device according to an exemplary embodiment of the present invention.

FIG. 7 is a cross-sectional view showing a light emitting area and a peripheral area adjacent to the light emitting area of a display device according to an exemplary embodiment of the present invention. In FIG. 7, the same reference numerals may refer to the same elements as in FIG. 5A, and thus duplicative descriptions may be omitted.

Referring to FIG. 7, the display device according to an exemplary embodiment of the present invention may include a cover layer CPL disposed on the second inorganic encapsulation layer IOL2. The cover layer CPL may overlap the light emitting area PXA and the peripheral area NPXA.

The cover layer CPL may include an inorganic material. The cover layer CPL may include a same material as the first inorganic encapsulation layer IOL1 and may be formed through the same process as the first inorganic encapsulation layer IOL1. In an exemplary embodiment of the present invention, since the second inorganic encapsulation layer IOL2 may be disposed between the first inorganic encapsulation layer IOL1 and the cover layer CPL, which may be formed through the same process, the first inorganic encapsulation layer IOL1 might not be in direct contact with the cover layer CPL, and thus stress applied to the display device may be reduced.

Figure 8A:
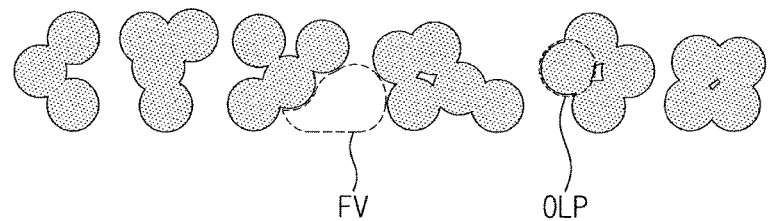
FIGS. 8A to 8C are schematic diagrams showing an upper structure of mixed encapsulation patterns according to an exemplary embodiment of the present invention.
Figure 8B:
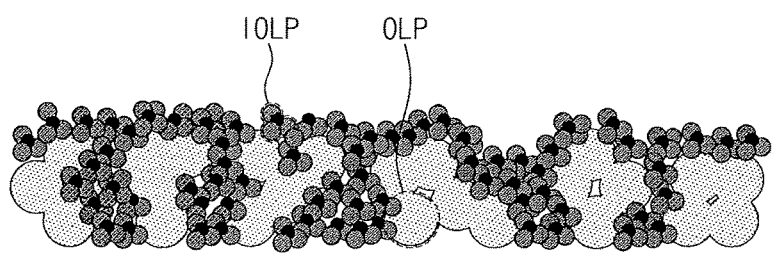
Figure 8C:
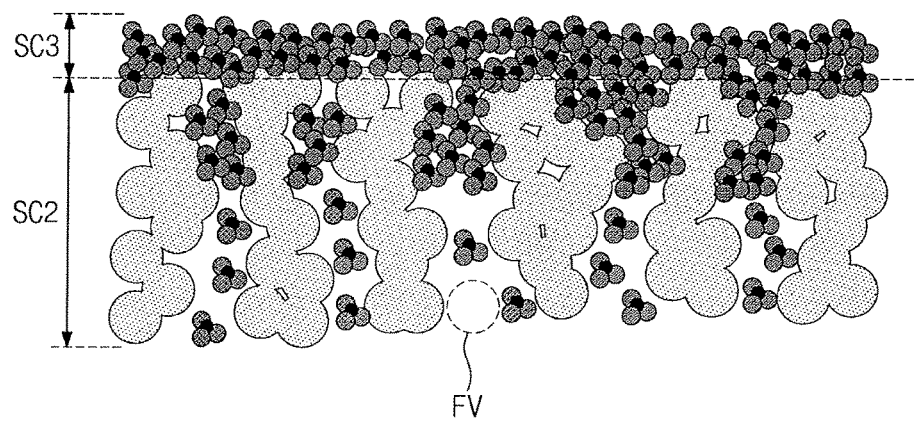

FIGS. 8A to 8C are schematic diagrams showing an upper structure of mixed encapsulation patterns according to an exemplary embodiment of the present invention.

Referring to FIGS. 8A and 8B, the mixed encapsulation pattern ENP of a display device according to an exemplary embodiment of the present invention may include an organic material and an inorganic material. The organic material may include a plurality of organic particles OLP, and the inorganic material includes a plurality of inorganic particles IOLP.

A free volume FV may be defined in the organic material. Referring to FIG. 8A, the free volume FV is represented by a dotted line. The free volume FV may be an empty space among the organic particles OLP. The inorganic material may substantially fill the free volume FV defined in the organic material. The inorganic particles IOLP of the inorganic material may be infiltrated into between the organic particles OLP and may be trapped in the free volume FV.

Referring to FIG. 8C, the second segment SC2 and the third segment SC3 may be positioned above the mixed encapsulation pattern ENP.

Since the inorganic particles IOLP may be infiltrated from an upper direction (e.g., from an upper direction of the second segment SC2 of the organic material), an amount of the inorganic particles IOLP infiltrated into between the organic particles OLP may decrease as a distance from an upper surface of the second segment SC2 increases. Thus, a charging rate of the inorganic particles IOLP with respect to the free volume FV of the organic material may be reduced as a distance from a lower surface of the second segment SC2 decreases.

The organic particles OLP, which are not infiltrated into the free volume FV, may be positioned on the organic material (e.g., the organic material including the organic particles OLP illustrated in FIG. 8A). Thus, the third segment SC3 may be formed by the inorganic particles IOLP on the second segment SC2.

A method of manufacturing a display device according to an exemplary embodiment of the present invention will be described in more detail below.

Figure 9:
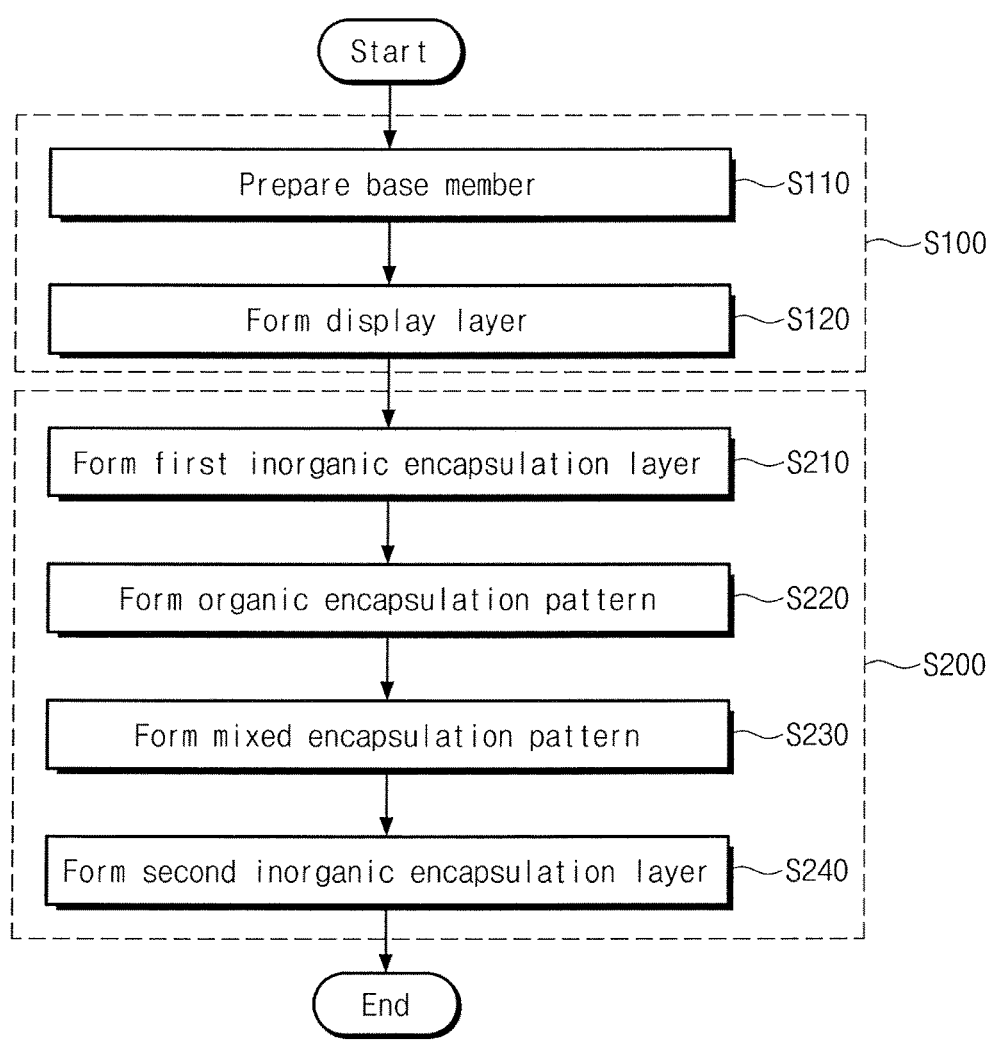
FIG. 9 is a flowchart showing a method of manufacturing a display device according to an exemplary embodiment of the present invention.

FIG. 9 is a flowchart showing a method of manufacturing a display device according to an exemplary embodiment of the present invention. FIGS. 10A to 10D are cross-sectional views showing a method of manufacturing a display device according to an exemplary embodiment of the present invention. FIGS. 11A to 11E are cross-sectional views showing a process of forming a mixed encapsulation layer in a portion DD of FIG. 10D.

Figure 10A:
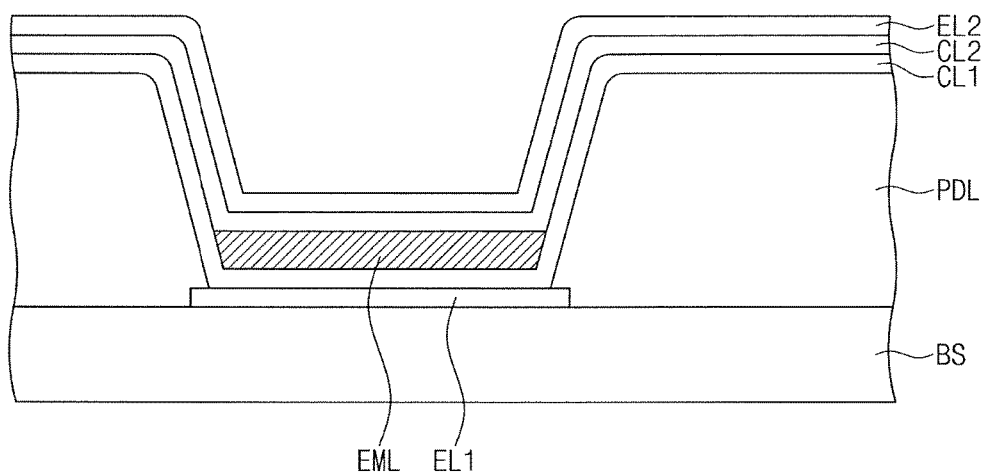
FIGS. 10A to 10D are cross-sectional views showing a method of manufacturing a display device according to an exemplary embodiment of the present invention.

Referring to FIGS. 9 and 10A, a manufacturing method of a display device according to an exemplary embodiment of the present invention may include preparing the display member including the light emitting area PXA and the peripheral area NPXA adjacent to the light emitting area PXA (S100). The preparing the display member (S100) may include preparing a base member (e.g., the base member BS) (S110) and forming the organic electroluminescent light emitting device OEL and the pixel definition layer PDL on the base member BS to form a display layer (e.g., the display layer DL) (S120). The organic electroluminescent light emitting device OEL may include the first electrode EL1 and the second electrode EL2 disposed on the first electrode EL1. The first common layer CL1, the second common layer CL2 and the light emitting layer EML may be disposed between the first electrode EL1 and the second electrode EL2 (see, e.g., FIG. 10B).

Figure 10B:
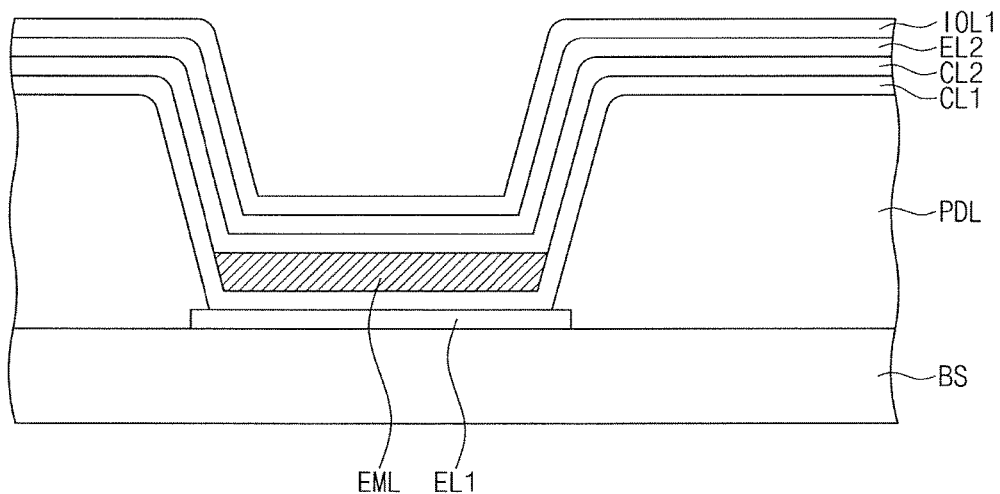

Referring to FIGS. 9 and 10B, the manufacturing method of the display device according to an exemplary embodiment of the present invention may include forming an encapsulation member on a display member (S200). The forming the encapsulation member (S200) may include depositing an inorganic material on the display member to form a first inorganic encapsulation layer (e.g., the first inorganic encapsulation layer IOL1) (S210). The first inorganic encapsulation layer IOL1 may be formed by a chemical vapor deposition (CVD) method; however, exemplary embodiments of the present invention are not limited thereto.

Figure 10C:
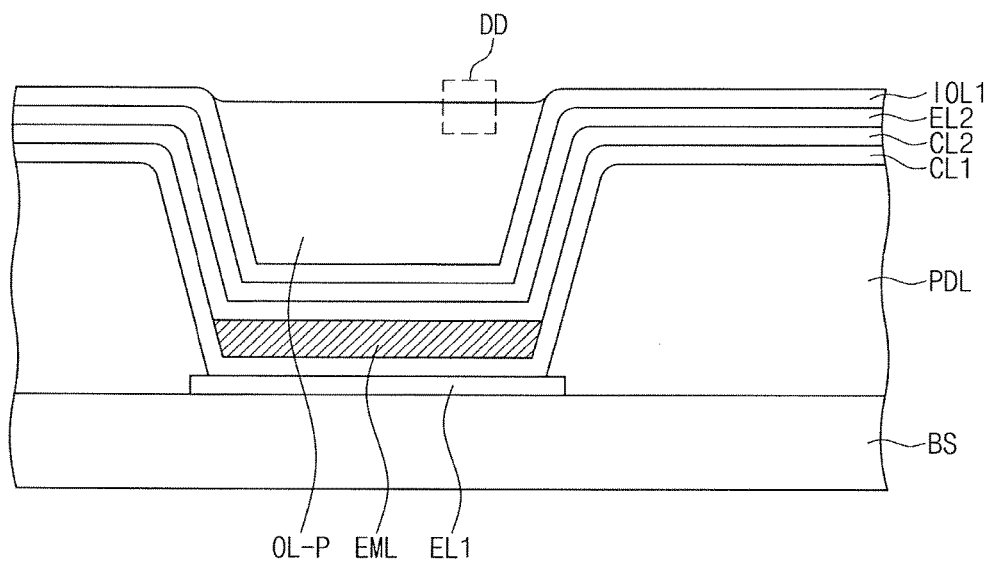

Referring to FIGS. 9 and 10C, the forming the encapsulation member (S200) may include patterning an organic material on the first inorganic encapsulation layer IOL1 to form an organic encapsulation pattern (e.g., the organic encapsulation pattern OL-P) (S220). The organic encapsulation pattern OL-P may be formed in an opening formed in or through the pixel definition layer PDL. The organic encapsulation pattern OL-P may be formed by a solution process; however, exemplary embodiments of the present invention are not limited thereto. For example, the organic encapsulation pattern OL-P may be formed by an inkjet printing method.

Figure 10D:
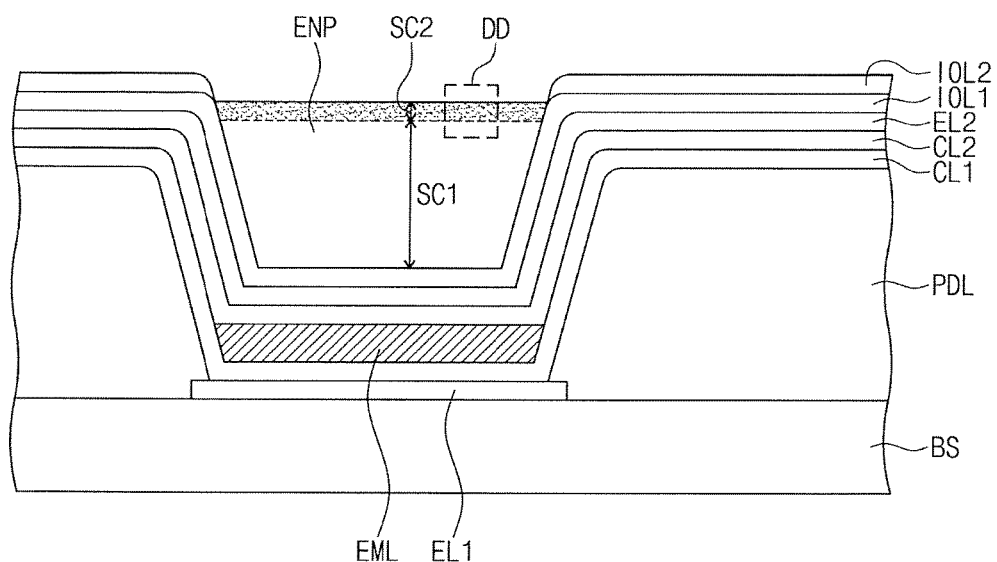

Referring to FIGS. 9 and 10D, the forming the encapsulation member (S200) may include allowing the inorganic material to be infiltrated into the organic encapsulation pattern to form a mixed encapsulation pattern (e.g., the mixed encapsulation pattern ENP) (S230) and depositing the inorganic material on the peripheral area to form a second inorganic encapsulation layer (e.g., the second inorganic encapsulation layer IOL2) (S240).

The forming the mixed encapsulation pattern ENP and the forming the second inorganic encapsulation layer IOL2 may be performed through a same process. As an example, due to the process of providing the inorganic material to the light emitting area PXA and the peripheral area NPXA, the inorganic material may be infiltrated into the organic encapsulation pattern OL-P overlapping the light emitting area PXA to form the mixed encapsulation pattern ENP, and the inorganic material may be deposited on the first inorganic encapsulation layer IOL1 on the peripheral area NPXA to form the second inorganic encapsulation layer IOL2.

The mixed encapsulation pattern ENP may be formed by a sequential vapor infiltration (SVI) method. The mixed encapsulation pattern ENP may be formed by the inorganic material infiltrated into the free volume of the organic encapsulation pattern OLP through the SVI method.

FIGS. 11A to 11E are cross-sectional views showing a process of forming a mixed encapsulation layer in a portion DD of FIG. 10D. Referring to FIGS. 11A to 11E, the forming the mixed encapsulation pattern (S230) may include diffusing first precursors PC1 into the free volume FV of the organic encapsulation pattern OL-P and diffusing second precursors PC2 to react with the first precursors PC1 to form the inorganic material (e.g., the inorganic particles IOLP) in the free volume FV.

Figure 11A:
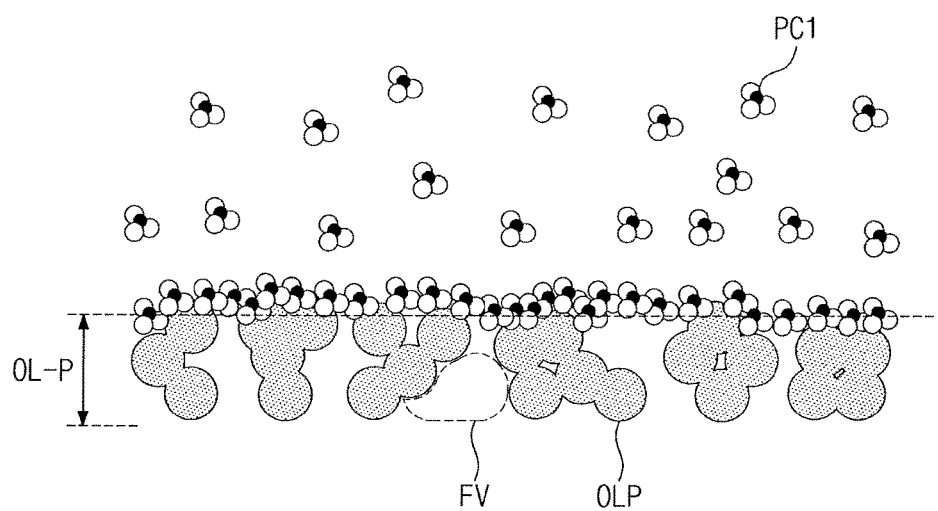
FIGS. 11A to 11E are cross-sectional views showing a process of forming a mixed encapsulation layer in a portion DD of FIG. 10D.

Referring to FIG. 11A, first precursors PC1 may be provided to the organic encapsulation pattern OL-P. The organic encapsulation pattern OL-P may include a plurality of organic particles OLP. The free volume FV may be defined in the organic encapsulation pattern OL-P. The free volume FV may refer to a substantially empty space not filled with the organic particles OLP. The organic particles OLP may be used to form the organic encapsulation pattern OL-P.

The first precursors PC1 may be disposed on the organic encapsulation pattern OL-P and may substantially cover an upper surface of the organic encapsulation pattern OL-P. The first precursors PC1 may include trimethylaluminum (TMA), triteriarybutyl aluminum (TTBA), or tert-butyliminotri(diethylamino)tantalum (TBTDET); however, exemplary embodiments of the present invention are not limited thereto.

Figure 11B:
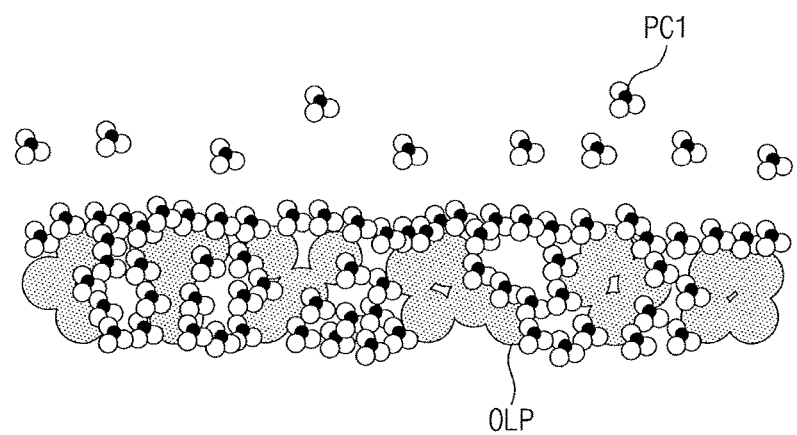

Referring to FIG. 11B, the first precursors PC1 may infiltrate the free volume FV of the organic encapsulation pattern OL-P. The first precursors PC1 disposed on the upper surface of the organic encapsulation pattern OL-P may be infiltrated into the organic encapsulation pattern OL-P and may diffuse into between the organic particles OLP.

The diffusing the first precursors PC1 may be performed for about 200 seconds to about 300 seconds. When the time during which the first precursors PC1 are diffused is smaller than about 200 seconds, the first precursors PC1 might not be sufficiently diffused in the free volume FV to form the organic encapsulation pattern OL-P. When the time during which the first precursors PC1 are diffused is greater than about 300 seconds, a process time becomes longer and the manufacturing method may become relatively inefficient.

Figure 11C:
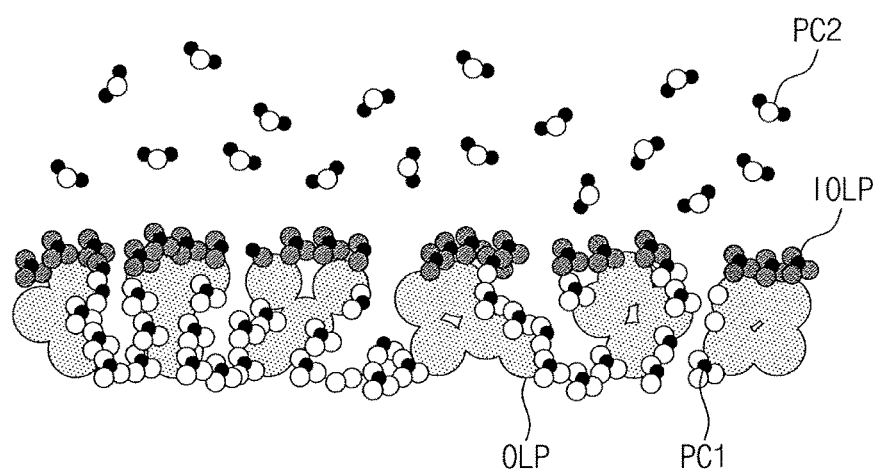

Referring to FIG. 11C, second precursors PC2 may be provided to the organic encapsulation pattern OL-P. The second precursors PC2 may react with the first precursors PC1 to form the inorganic particles IOLP. The second precursors PC2 may include water ($H_2O$), ozone ($O_3$) or ammonia ($NH_3$); however, exemplary embodiments of the present invention are not limited thereto.

Figure 11D:
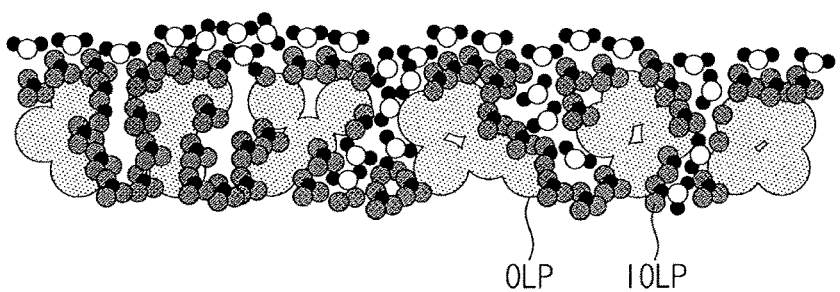

Referring to FIG. 11D, the second precursors PC2 may infiltrate the free volume FV of the organic encapsulation pattern OL-P. The second precursors PC2 may react with the first precursors PC1 in the free volume FV. The second precursors PC2 may react with the first precursors PC1 infiltrated into the free volume FV to form the inorganic particles IOLP. As an example, the second precursors PC2 may react with the first precursors PC1, and thus the inorganic material may be formed in the free volume FV.

The diffusing the second precursors PC2 may be performed similar to the diffusion of the first precursors PC1. For example, the diffusing the second precursors PC2 may be performed for about 200 seconds to about 300 seconds. When the time during which the second precursors PC2 are diffused is smaller than about 200 seconds, the second precursors PC2 might not be sufficiently diffused into the free volume FV to react with the first precursors PC1 and to form the organic encapsulation pattern OL-P. When the time during which the second precursors PC2 are diffused is greater than about 300 seconds, a process time becomes longer and the manufacturing method may become relatively inefficient.

The forming the mixed encapsulation pattern (S230) may be performed by repeatedly executing the diffusing of the first precursors PC1 and the diffusion of the second precursors PC2. As an example, the first precursors PC1 may be diffused into the free volume FV, the first precursors PC1 may react with the second precursors PC2 in the free volume FV, and then the diffusion process of the second precursors PC2 may be performed again, as desired. When the diffusion of the first precursors PC1 and the diffusion of the second precursors PC2 are repeatedly performed, the inorganic material may be sufficiently infiltrated into the free volume FV of the organic encapsulation pattern OL-P to form the mixed structure of the mixed encapsulation pattern ENP.

Figure 11E:
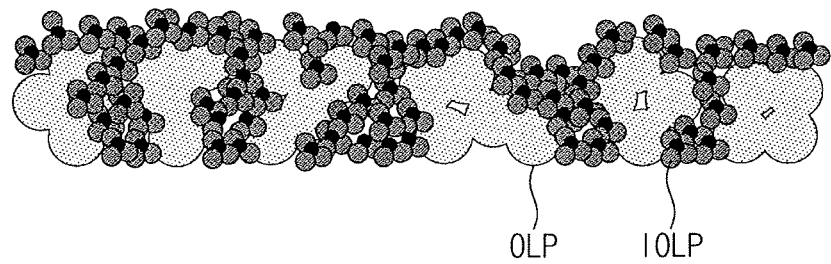

Referring to FIG. 11E, When the diffusion of the first precursors PC1 and the diffusion of the second precursors PC2 are repeatedly performed, the inorganic particles IOLP may be sufficiently filled in the free volume FV to form the organic encapsulation pattern OL-P. The organic encapsulation pattern OL-P may have the structure in which an organic material is mixed with an inorganic material since the inorganic particles IOLP are formed in the free volume FV existing between the organic particles OLP.

Referring to FIG. 10D, the mixed encapsulation pattern ENP including the first segment SC1 and the second segment SC2 may be formed. The first segment SC1 may include an organic material, and the second segment SC2 may include the organic material and the inorganic material filtrated into and mixed with the organic material. The mixed encapsulation pattern ENP may be formed by the inorganic particles infiltrated into the upper portion of the organic encapsulation pattern OL-P. The mixed encapsulation pattern ENP may be formed by the processes described with reference to FIGS. 11A to 11E.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
    a display member comprising a plurality of light emitting areas and a peripheral area adjacent to the light emitting areas; and
    an encapsulation member disposed on the display member, the encapsulation member comprising:
        a first inorganic encapsulation layer;
        a plurality of mixed encapsulation patterns disposed on the first inorganic encapsulation layer, wherein each of the mixed encapsulation patterns overlaps a corresponding light emitting area of the plurality of light emitting areas when viewed in a plan view; and
        a second inorganic encapsulation layer disposed on the first inorganic encapsulation layer, wherein the second inorganic encapsulation layer overlaps the peripheral area and the second inorganic encapsulation layer does not overlap the plurality of light emitting areas when viewed in the plan view,
        wherein each of the mixed encapsulation patterns comprises a first segment adjacent to the first inorganic encapsulation layer when viewed in a cross section and a second segment disposed on the first segment, wherein the first segment comprises an organic material, and wherein the second segment comprises a mixture of the organic material and an inorganic material.

2. The display device of claim 1, wherein an amount of the inorganic material in the second segment varies along a thickness direction of the mixed encapsulation patterns.

3. The display device of claim 2, wherein the amount of the inorganic material decreases as a distance from the first segment decreases.

4. The display device of claim 1, wherein each of the mixed encapsulation patterns comprises a free volume of the organic material defined therein, and wherein the inorganic material of the second segment is filled in at least a portion of the free volume.

5. The display device of claim 4, wherein an amount of the inorganic material in the free volume decrease as a distance from the first segment decreases.

6. The display device of claim 1, wherein each of the mixed encapsulation patterns further comprises a third segment disposed on the second segment, and wherein the third segment comprises an inorganic material and has a shape integrally formed with the second inorganic encapsulation layer.

7. The display device of claim 1, wherein the second inorganic encapsulation layer comprises a same inorganic material as the inorganic material included in the second segment of each of the mixed encapsulation patterns.

8. The display device of claim 1, wherein the display member further comprises a pixel definition layer comprising a plurality of openings, wherein each of the openings is formed above a corresponding light emitting area of the plurality of light emitting areas, and wherein the mixed encapsulation patterns are each respectively disposed in one of the openings.

9. The display device of claim 8, wherein the first inorganic encapsulation layer is disposed on the pixel definition layer, and wherein the second inorganic encapsulation layer is in direct contact with the first inorganic encapsulation layer.

10. The display device of claim 1, further comprising a plurality of dummy mixed patterns disposed in the peripheral area, wherein each of the dummy mixed patterns comprises the organic material and the inorganic material mixed with the organic material.

11. The display device of claim 10, wherein each of the dummy mixed patterns comprises a first dummy segment adjacent to the first inorganic encapsulation layer and a second dummy segment disposed on the first dummy segment, wherein the first dummy segment comprises an organic material, and wherein the second dummy segment comprises a mixture of the organic material and an inorganic material.

12. The display device of claim 10, wherein at least a portion of the dummy mixed patterns is connected to at least one of the mixed encapsulation patterns.

13. The display device of claim 1, wherein the second segment has a thickness of from about 50 angstroms to about 100 angstroms.

14. The display device of claim 1, further comprising a cover layer disposed on the second inorganic encapsulation layer to cover the second inorganic encapsulation layer.

15. A display device comprising:
    a display member comprising a plurality of light emitting areas and a peripheral area adjacent to the light emitting areas; and
    an encapsulation member disposed on the display member, the encapsulation member comprising:
        a first inorganic encapsulation layer;
        a plurality of mixed encapsulation patterns disposed on the first inorganic encapsulation layer, wherein each of the mixed encapsulation patters overlaps a corresponding light emitting area of the plurality of light emitting areas when viewed in a plan view; and
        a second inorganic encapsulation layer disposed on the first inorganic encapsulation layer, wherein each of the mixed encapsulation patters comprises a first segment adjacent to the first inorganic encapsulation layer when viewed in a cross section and a second segment disposed on the first segment, wherein the first segment comprises an organic material, and wherein the second segment comprises a mixture of the organic material and an inorganic material,
        wherein the second inorganic encapsulation layer is not overlapped with the mixed encapsulation patterns when viewed in a plan view.

16. A display device, comprising:
    a display member comprising a plurality of light emitting areas and a plurality of peripheral areas, wherein each of the light emitting areas comprises a light emitting layer disposed on a base substrate;
    a pixel definition layer disposed on the base substrate, wherein the pixel definition layer includes a plurality of holes, and wherein each of the holes is respectively positioned over one of the light emitting areas; and
    a mixed encapsulation pattern formed in each of the holes, wherein the mixed encapsulation pattern overlaps a light emitting area of the plurality of light emitting areas in a plan view and does not overlap the plurality of peripheral areas in the plan view, wherein the mixed encapsulation pattern comprises a first region including an organic material and a second region including an organic material and an inorganic material formed on the first region, and wherein an amount of the inorganic material included in the second region increases toward an upper surface of the second region.

17. The display device of claim 16, wherein the inorganic material of the second region is in a free volume of the second region,
   wherein a first inorganic encapsulation layer is positioned above the pixel definition layer and a second inorganic encapsulation layer is disposed on the first inorganic encapsulation layer, and
   wherein the second inorganic encapsulation layer overlaps the pixel definition layer when viewed in the plan view, and the second inorganic encapsulation layer does not overlap the plurality of holes when viewed in the plan view.

18. The display device of claim 17, wherein the mixed encapsulation pattern further comprises a third region formed on the second region, and wherein the third region comprises a greater amount of the inorganic material than the second region.

19. The display device of claim 18, wherein the second region has a thickness of from about 50 angstroms to about 100 angstroms.

20. The display device of claim 19, wherein the third region has a smaller thickness than the second region.

* * * * *